United States Patent [19]

Welkie

[11] Patent Number: 4,661,702
[45] Date of Patent: Apr. 28, 1987

[54] PRIMARY ION BEAM RASTER GATING TECHNIQUE FOR SECONDARY ION MASS SPECTROMETER SYSTEM

[75] Inventor: David G. Welkie, Chanhassen, Minn.

[73] Assignee: The Perkin-Elmer Corporation, Norwalk, Conn.

[21] Appl. No.: 664,196

[22] Filed: Oct. 24, 1984

[51] Int. Cl.[4] ............................................. G01N 23/00
[52] U.S. Cl. .................................. 250/309; 250/306; 250/307
[58] Field of Search ........................ 250/306, 307, 309

[56] References Cited

U.S. PATENT DOCUMENTS

| | | | |
|---|---|---|---|
| 3,881,108 | 4/1975 | Kondo et al. | 250/309 |
| 3,916,190 | 10/1975 | Valentine et al. | 250/309 |
| 4,132,892 | 1/1979 | Wittmaack | 250/309 |
| 4,510,387 | 4/1985 | Izumi et al. | 250/309 |

Primary Examiner—Bruce C. Anderson
Attorney, Agent, or Firm—Ronald G. Cummings; Francis L. Masselle; Edwin T. Grimes

[57] ABSTRACT

A primary ion beam raster gating technique for secondary ion mass spectrometer system is disclosed. The system includes a primary ion gun which raster scans an area of the surface being tested which sputter etches a crater. After the crater is formed, a beam blanking circuit causes the beam to scan a smaller area at the bottom of the first crater thereby sputter etching a second smaller crater. During this phase, the ion beam does not hit the side wall of the first crater so that errors are not introduced into secondary ion measurement from the bottom of the second crater due to material from the side wall of the first crater being sputtered into the second crater.

8 Claims, 5 Drawing Figures

PRIMARY ION BEAM RASTER GATING TECHNIQUE FOR SECONDARY ION MASS SPECTROMETER SYSTEM

FIELD OF THE INVENTION

The present invention relates broadly to the field of secondary ion mass spectrometry and particularly to a method and apparatus for blanking the primary ion beam to eliminate one source of erroneous data to thereby extend the dynamic range of the instrument.

BACKGROUND OF THE INVENTION

In the field of secondary ion mass spectrometry depth profiling, a technique for analyzing the chemical components of the surface of an object, a primary ion beam is directed onto the surface which is being analyzed. The primary ion beam is scanned in a raster pattern over the surface. As the beam is scanned, the surface is sputter etched and some of the atoms leave as secondary ions. The secondary ions are then introduced into a mass spectrometer and the ion can then be identified.

In the normal course of operating such an instrument, the beam scanning produces a small crater in the surface being investigated. As the crater becomes deeper, the beam hits the side wall of the crater. This causes some of the side wall material to be sputtered into the crater. Thereafter, the material is again sputtered and detected by the mass spectrometer thus creating the mistaken impression that the ion came from the crater depth then being sputtered as opposed to being from the side wall at some other depth.

As a result of the sputtering of the crater side wall into the crater, an error or background signal is produced in a secondary ion mass spectrometer depth profile. The background signal thus serves to limit the range over which accurate measurements can be made.

The prior art has been to prevent this by simply increasing the primary beam scan magnification, thereby reducing the raster scan size, when such crater wall sputtering became a significant source of background signal. The undesirable consequences of this procedure are that (1) the sputter rate changes (increases) due to the decrease in sputtered area, and (2) the probability that a sample atom will be sputtered as an ion (as opposed to a neutral) may change due to the change in the local exposure to a reactive gas (in the case of inert ion bombardment with reactive gas exposure for ion yield enhancement). Both of these effects make data quantitation more difficult.

In view of the above mentioned problems, it is the principal objective of the present invention to eliminate one source of background signal that manifests itself in a secondary ion mass spectrometer depth profile.

BRIEF DESCRIPTION OF THE INVENTION

In achieving the above stated principal objective of the invention, an ion gun is utilized to produce the primary ions. The gun includes a plurality of beam focusing and scanning electrodes to cause the ion beam to move in a raster scan pattern across the surface being tested. Electronic circuitry is coupled to the ion gun so that when the sputter-etched crater reaches a given depth or a certain time has elapsed, the scanning of the beam in the crater is restricted so that the beam does not thereafter hit the side wall of the original crater. In this manner, only the control area of the crater is etched further. As such, there is no contamination of the central area of the crater due to atoms or ions of the material at the edge of the crater being dislodged by the primary ion beam and falling into the central region which is then being sputter etched.

DETAILED DESCRIPTION

Figure 1:
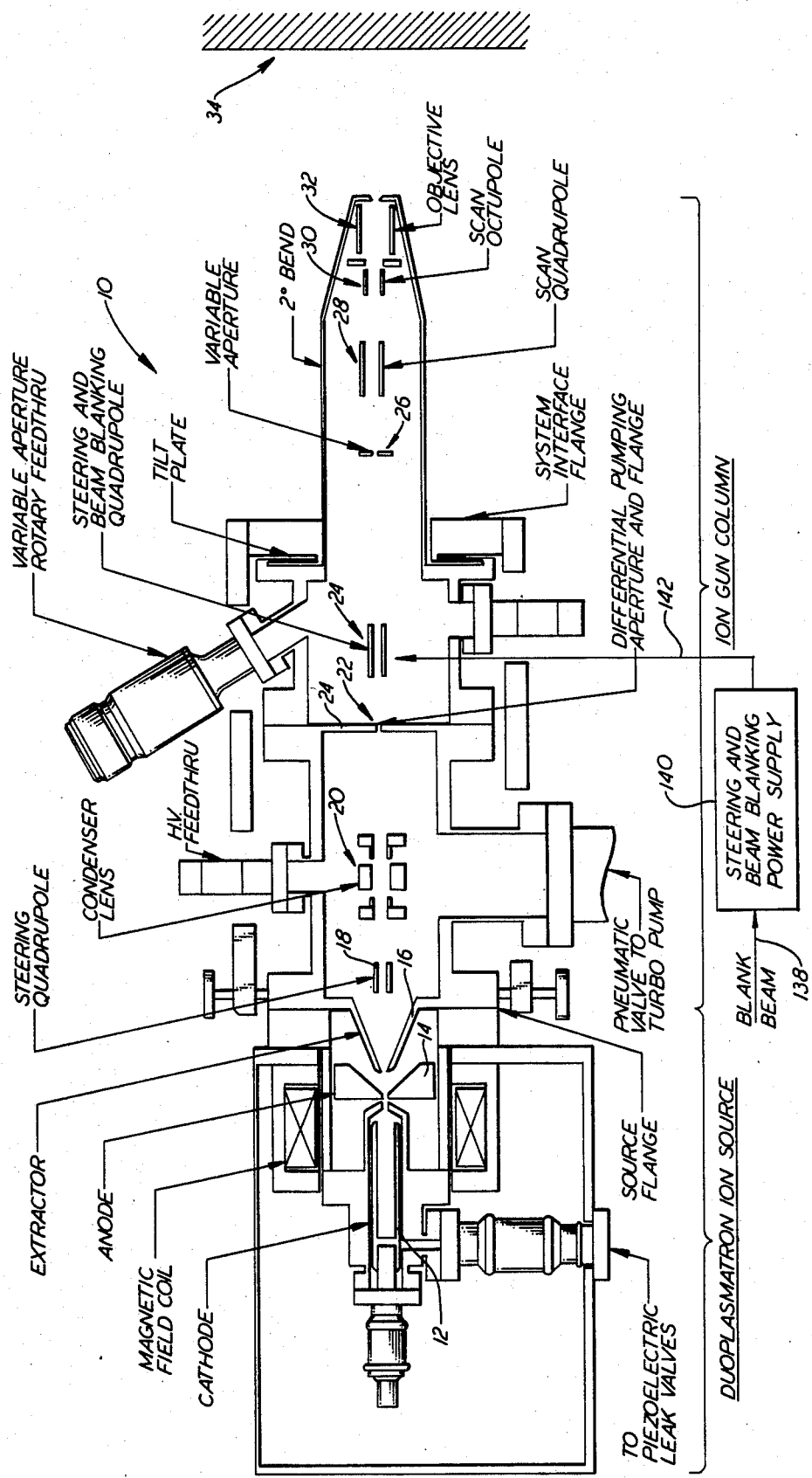
FIG. 1 schematically illustrates the ion gun of the present invention.

FIG. 1 is a diagram of the ion gun 10 of the present invention taken along the length of the longitudinal axis (not shown) thereof. The ion source of the preferred embodiment of the present invention is that in the Perkin-Elmer Model 6300 and is described in my copending patent application U.S. Ser. No. 833,575 filed Feb. 26, 1986 titled "Vacuum-Compatible Air-Cooled Plasma Device". some of the ions pass through a central opening and are accelerated in a direction generally towards the extractor 16. Those ions which are moving substantially along the axis of the central extractor opening pass through a steering quadrupole 18, a condenser lens 20 and the opening 22 through the flange 24. The ion beam then passes through a steering and beam blanking quadrupole which further aligns the beam with the centrally located aperture in the variable aperture 26. Thereafter, the beam passes through the scan quadrupole 28 which is utilized in developing the scanning motion of the beam that exits the ion gun as well as bending the beam by approximately 2° due to a fixed potential being placed thereon. This 2° bending of the beam realigns it with the axis of the scan octupole 30 and the objective lens 32. The desirability of this bending of the beam is to eliminate neutral particles from exiting the gun through the objective lens 32. This is made possible because the neutral particles traveling as part of the ion beam are not affected by the potential on the scan quadrupole 28. Accordingly, these neutral particles continue moving along the axis which projects through the anode 14, the condenser lens 20 and the steering and beam blanking quadrupole 24 and ultimately strikes some surface within the ion gun thereby preventing them from exiting through the objective lens 32 in a direction towards the surface 34 being tested.

Figure 2:
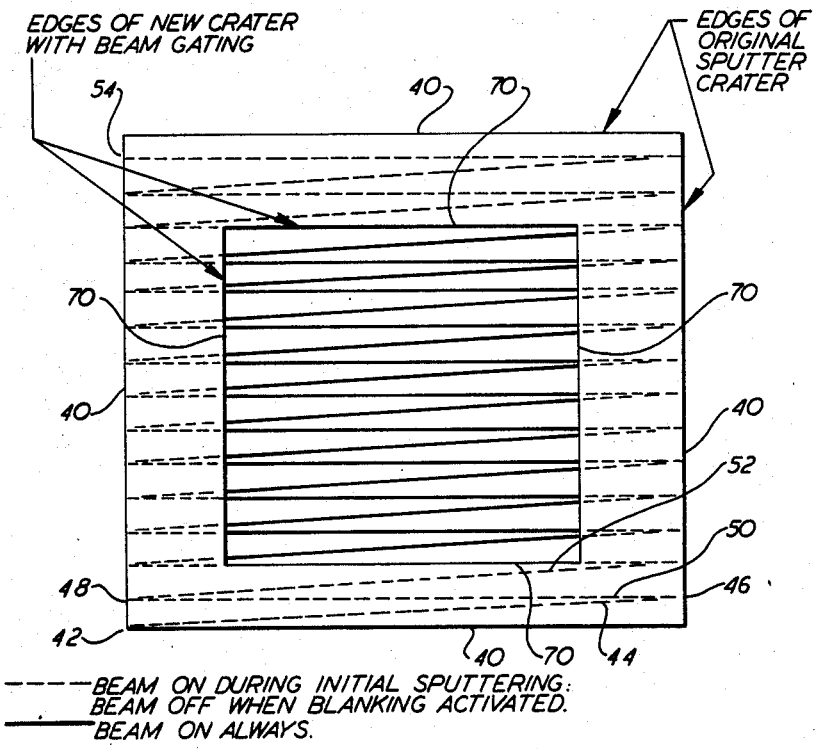
FIG. 2 illustrates the raster scan of the primary ion beam from the ion gun of FIG. 1 on the surface being analyzed.

Raster scan electronics of the type already well known is provided in cooperation with the ion gun of FIG. 1 to produce a raster scan pattern of the type illustrated in FIG. 2 within the edge of the original sputter crater 40. The scan begins, for example, at the corner 42 and slowly follows the dotted line 44 to the edge point 46. At this point, the ion beam is rapidly returned to the edge point 48 along the dotted line 50 and the slower speed scanning is resumed along the dotted line 52. In this manner, the beam is traced from left to right at a relatively slow speed and during this scan it also moves gradually upwardly at an even slower speed. Thus, when the beam reaches the right-most edge 40 as illustrated in FIG. 2, the beam rapidly returns to the left margin and resumes slow scanning to the right and upwardly. This scanning of the ion beam onto the surface being tested continues until the beam reaches the point indicated at 54. Then, the electronics coupled to the gun causes the beam to start again at some point along the lower and follow the scanning pattern previously described.

As the beam scans over the surface, as already indicated, it causes particles to be sputtered and secondary ions to be produced and, as a result, the beam gradually digs a hole into the surface. This process is known as sputter etching. In typical applications, the area which is hit by the ion beam from the ion gun of FIG. 1 is approximately 1 square millimeter although a larger or a smaller area may be utilized. The crater depth may typically be as deep as 1 to 2 microns although shallower and deeper craters are frequently utilized.

Figure 3:
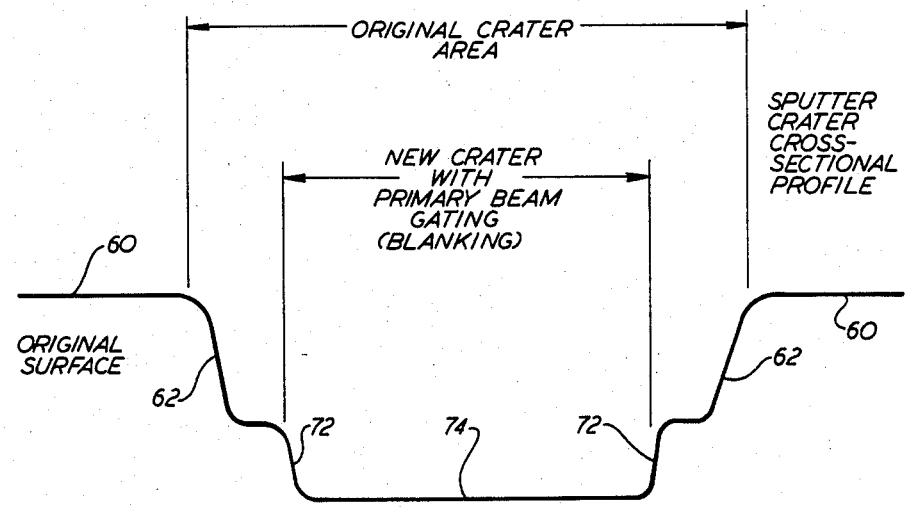
FIG. 3 illustrates the cross-sectional profile of a sputter crater produced by the present invention.

FIG. 3 illustrates a cross-sectional profile of a sputter crater produced by the apparatus according to the present invention. The surface of the object being tested 60 is typically flat. As the ion beam digs the crater, a sharply tapering side wall 62 is cut into the surface and this wall 62 defines the outer perimeter of the sputer crater produced by the beam scanning, for example, in FIG. 2, from point 42 to 46. As it is clear from the illustration of FIG. 2, as the beam traverses the crater, it does come into contact with the side wall 62. When this happens, some of the material of the side wall may be sputtered into the bottom of the crater. Thereafter, this material may be resputtered as ions and detected by the mass spectrometer (not shown) thereby giving the false impression that the material originated from the bottom of the crater as opposed from somewhere further up the side wall 62. Accordingly, an erroneous indication can be produced by the instrument.

In accordance with the present invention, however, this source of erroneous information is largely eliminated. After a period of time when the ion beam is allowed to scan across the original crater, an electronic circuit becomes active to reduce the area of scanning of the ion beam so that the beam no longer comes in contact with the crater side wall 62. The new smaller area in which the beam is allowed to scan is delimited by the square boundary 70. During this phase of the operation, the beam is said to be blanked out by the electronic circuitry when it is traversing areas between the square 70 and the outer square 40. Accordingly, a smaller or new crater is dug into the surface being tested and the extremes of movement of the unblanked primary ion beam is the tapering side walls 72 as illustrated in FIG. 3. It will also be clear from FIG. 3 that the beam from the ion gun of FIG. 1, when it is blanked to prevent raster scanning outwardly of the wall 72 will not strike the wall 62 and, therefore, contamination of the central part of the crater 74 is eliminated as the beam cannot contact the wall 62.

The end result of the sputter etching is to create a large crater with a smaller crater etched into the bottom of the large crater. Those of skill in the art will recognize that the process of the present invention could also be utilized with three or more symetrically dug holes with each successively dug hole being smaller in perimeter than the previous one.

It will also be recognized that the spectrometer should also be gated in synchronism with the sputter etching of the surface being examined. The spectrometer should be turned off whenever the ion beam is near a crater side wall as an ion may be detected that originated from the side wall and be treated as if it came from the crater bottom. This would add an error to the measurements which is easily avoided by allowing the spectrometer to operate only when the ion beam is truly directed to hit only the crater bottom.

Figure 4:
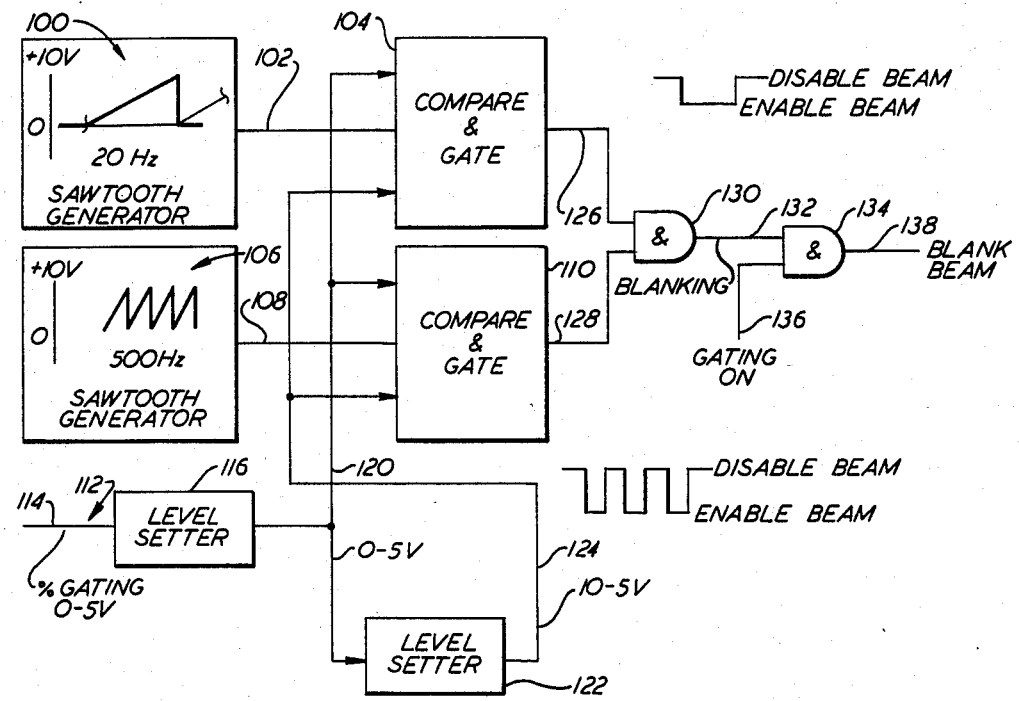
FIG. 4 illustrates schematically the electronics utilized to control the ion beam so that the cross-section profile of FIG. 3 can be created with the ion gun of FIG. 1.

Referring now to FIG. 4, the electronic circuitry for coupling to the steering and beam blanking quadrupole 24 in the ion gun of FIG. 1 is illustrated. In ion guns of the sort illustrated in FIG. 1, sawtooth signals are applied to the various quadrupoles and the like to scan the beam in the manner desired such as in FIG. 2. In the case of the circuit of FIG. 4, a y axis scanning sawtooth signal generator is illustrated at 100. In the preferred embodiment of the present invention, this sawtooth signal has a frequency of approximately 20 Hz with an amplitude ranging from 0 to +10 volts. This sawtooth signal is applied to the line 102 which couples to the compare and gate circuit 104.

A second sawtooth signal generator for scanning the x-axis is illustrated at 106 which, in the preferred embodiment of the present invention, comprises a sawtooth signal at approximately 500 Hz having a minimum voltage of 0 and a maximum of +10 volts. This second sawtooth signal is coupled via line 108 to a second compare and gate circuit 110. The frequency of the second sawtooth signal preferably is not an integral multiple of the frequency of the first sawtooth signal.

A percentage of gating signal indicated at 112 is applied to the line 114 which connects to a level setter circuit 116. The percentage of gating signal, when it is 0, indicates that there should be no blanking of the ion beam during any of its raster scan. On the other hand, if the percentage of gating signal 112 is at 5 volts, this indicates that the beam should be blanked all the time. The level setter 116 serves to produce a level on the output line 120 which ranges between 0 and 5 volts and this signal is applied to one input to the compare and gate circuits 104 and 110. The signal on line 120 is also applied to the input of a second level setter circuit 122 which produces at its output on line 124 a signal ranging between 10 and 5 volts. When the voltage at the input to the level setter 122 is 0 volts, the output is 10 volts. On the other hand, when the level on line 120 is 5 volts, the level on line 124 is also 5 volts. The line 124 also couples to the compare and gate circuits 104 and 110.

The compare and gate circuit 104 produces a signal at its output on line 126 which is at a high level whenever the signal on line 102 is either below the voltage on line 120 or above the voltage on line 124. In a similar manner, the compare and gate circuit 110 produces a output on line 128 which is high whenever the voltage on the line 108 is less than the voltage on line 120 or higher than the voltage on line 124. The signal on the line 102 comprises the low frequency scanning signal and that on line 108 comprises the high frequency scanning signal.

The signals on line 126 and 128 are applied to an AND gate 130 which produces a level at its output which corresponds to a blank the beam signal whenever either input line 126 or 128 is high. On the other hand, the AND gate 130 produces a signal at its output corresponding to a beam enable signal whenever the level on line 126 and 128 is low.

The enable beam signal appearing at the output of the AND gate 130 is coupled via a line 132 to an AND gate 134. The second input to the AND gate 134 is a gating on signal 136 which is generated by any of numerous sources including a switch under operator control. In the preferred embodiment, however, the gating on signal on the line 136 is off so that the signal on line 132 is blocked from passing through the AND gate 134 to the output line 138. In this mode, accordingly, the signal on the line 138 has no effect on the ion beam from the ion gun of FIG. 1. On the other hand, when the level on the line 136 is opposite to that just mentioned, the AND gate 134 is conditioned so that the signal appearing on the line 132 will pass therethrough to line 138. In this mode, the signal on the line 138 will cause the beam produced by the ion gun of FIG. 1 to be turned off whenever the signal on the line 132 indicates that it should be off. Likewise, the signal on the line 138 will cause the beam of the ion gun of FIG. 1 to be on whenever the signal on line 132 indicates should be on.

The beam blanking signal is coupled from line 138 to the steering and beam blanking power supply 140 illustrated in FIG. 1. When the signal on the line 138 corresponds to that indicating that the beam should be blanked, the steering and beam blanking power supply 140 places a bias voltage on the line 142 which couples to the steering and beam blanking quadrupole 24. This voltage is sufficient to cause all of the ions passing through the steering and beam blanking quadrupole 24 to be redirected so that they will not exit the ion gun through the objective lens 32. In this manner, the beam from the gun of FIG. 1 is turned off.

It will be recognized by those of skill in the art that the steering and beam blanking quadrupole 24 comprises 4 plates which are physically located around the beam as it passes therethrough on its way towards the objective lens 32. Each of these 4 plates must have an electrical potential thereon in order to accomplish directing of the beam. Accordingly, the steering and beam blanking power supply 140 in actuality comprises a power supply output which couples to each of the 4 plates comprising the steering and beam blanking quadrupole 24. The magnitude of the bias voltage produced thereby in response to the blank beam signal on line 138 varies from ion gun to ion gun, however, it is selected for each gun to accomplish the objective of ensuring that no ions exit from the gun when the beam blanking signal appears on the line 138.

Figure 5:
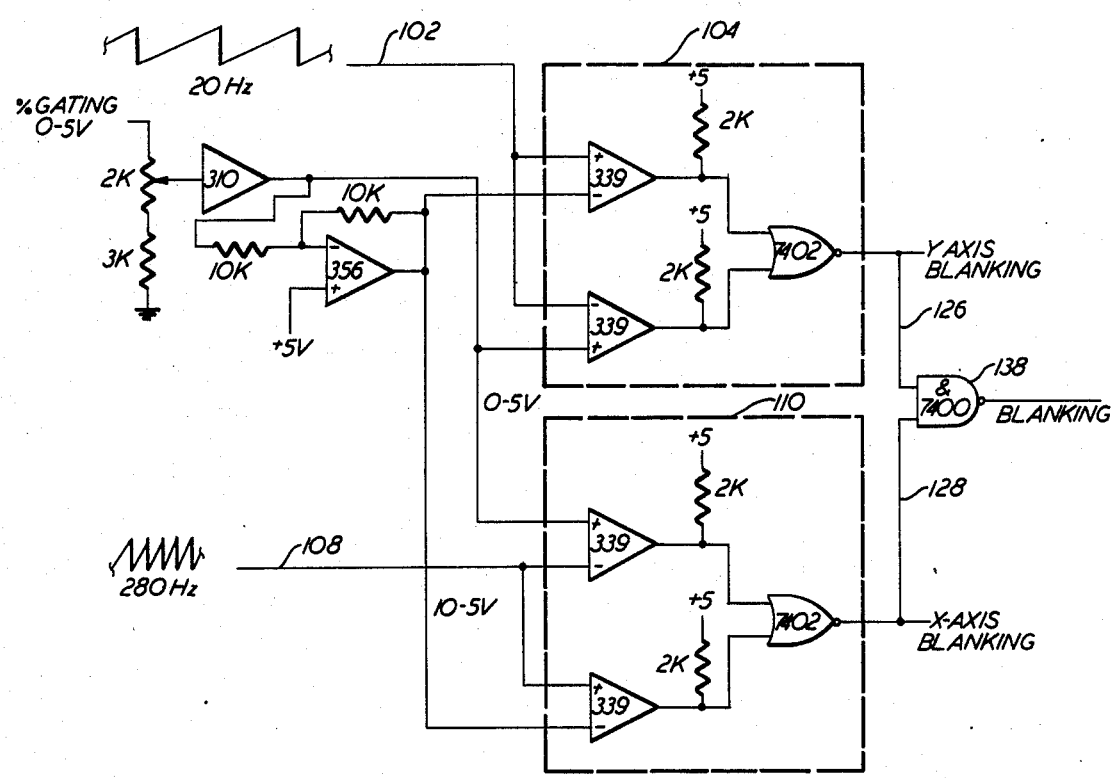
FIG. 5 is a detailed circuit diagram for most of the circuitry of FIG. 4.

The circuitry of FIG. 4 has been described above primarily in functional terms, however, the circuit diagram of FIG. 5 implements those functions using conventional circuit elements there illustrated. As the circuitry of FIG. 5 performs the functions already described, it will not be further described here.

The foregoing description has made particular emphasis on the circuit diagrams which embody the preferred embodiment of the present invention which is found in the Perkin-Elmer Model 6300 system. As indicated, the gating on signal on the line 136 of FIG. 4 is operative to turn on the blanking control circuitry of FIG. 4 so that the beam of the gun of FIG. 1 is turned on and off as it traverses the area within the square 40 as illustrated in FIG. 2. Further, the beam is only on when the control circuitry is causing the beam to traverse the area within the square 70. The signal on the line 136 is actuated in a plurality of ways. One way, for example, is for the operator to simply throw a switch when it is desired to sputter etch a smaller area than is currently being sputter etched by the gun of FIG. 1. Alternatively, the signal on the line 136 can be controlled by a timer so that beam blanking will begin to occur a given amount of time after the start of operation of the ion gun of FIG. 1. Yet a third alternative to turning the signal on line 136 on is to incorporate some form of depth measurement apparatus to measure the depth of the sputter crater produced by the ion gun of FIG. 1 and, when the depth reaches a predetermined depth, the gating signal on line 136 is then turned on. In addition to the three methods already stated for turning on the gating signal on the line 136, those of skill in the art will readily recognize that numerous other possibilities exist as well.

While the foregoing description has made particular emphasis on the circuit diagrams as illustrated in the figures, those of skill in the art will readily recognize that numerous modifications of these circuits may be made without departing from the spirit and scope of the present invention as defined in the following claims.

What is claimed is:

1. A primary ion gun usable in a secondary ion mass spectrometer system for analyzing a surface comprising, in combination:
    an ion source;
    means to produce from said ions a primary ion beam;
    a plurality of ion beam directing plates disposed around the path of said primary ion beam, the electrical potential thereon being operative to redirect the beam;
    beam scanning means coupled to at least one of said plates to cause the electrical potential to repetitively vary with time so that the beam is directed in a repetitive pattern over the surface being analyzed to produce a first crater therein;
    means to produce a gating signal to indicate that the area scanned by the beam on the surface being analyzed should be made smaller;
    means responsive to said gating signal for blanking the beam thereby preventing the beam from striking a selectable area on the surface being analyzed so that the area thereafter subject to being hit by the ion beam is smaller than the area hit by the ion beam prior to the time said gating signal is produced for producing a second crater within the first crater.

2. A primary ion gun usable in a secndary ion mass spectrometer system for analyzing a surface comprising, in combination:
    an ion source;
    means to produce from said ions a primary ion beam;
    a plurality of ion beam didrecting plates disposed around the path of said primary ion beam, the electrical potential thereon being operative to redirect the beam;
    beam scanning means coupled to at least one of said plates to cause the electrical potential to repetitively vary with time so that the beam is directed in a repetitive pattern over the surfce being analyzed to produce a first crater within said surface;
    means to produce a gating signal to indicate that the area scanned by the beam on the surface being analyzed should be made smaller; and
    means responsive to said gating signal for blanking the beam thereby preventing the beam from striking a selectable area on the surface being analyzed so that the area thereafter subject to being hit by the ion beam is smaller than the area hit by the ion beam prior to the time said gating signal is produced for producing a second crater within the first crater, said scanning means includes two sawtooth signals at two different frequencies, the beam traversing an area on the surface being analyzed in response to said two sawtooth signals, said means responsive to said blanking signal being additionally responsive to said two sawtooth signals to cause the beam to be blanked whenever either said sawtooth signal is above a given first value or below a second value.

3. The primary ion gun of claim 2 wherein said first value and said second value are selectable.

4. The primary ion gun of claim 1 wherein a fixed bias potential is applied to at least one of said plates to redirect the beam internally to exit the ion gun through an opening which is not in a straight line relationship with said ion source thereby preventing neutral particles in the beam from exiting from the ion gun.

5. A method for operating the primary ion gun of a secondary ion mass spectrometer system comprising the steps of:
scanning the primary ion beam over a predefined area of the surface being tested for a period of time to thereby sputter etch a crater to a first depth, and
scanning the primary ion beam over an area smaller than said predefined area so that the primary ion beam does not contact the walls of the crater to said first depth and creates a smaller crater to a second depth whereby testing of secondary ions from said smaller area is not contaminated by particles coming from the walls of the crater to said first depth.

6. The method of claim 5 additionally including the step of bending the ion beam in the ion gun by applying a bias to a plurality beam directing plates therein which are used also in redirecting the beam so that neutral particles in the beam cannot exit from the gun.

7. A primary ion gun usable in a secondary ion mass spectrometer system comprising, in combination:
an ion source;
means to accelerate ions from said source to form a primary ion beam;
a plurality of electrically chargeable plates disposed along the path of said primary ion beam, said plates being coupled to external power supplies for controlling the voltage thereon, the controlled voltage being operable to redirect the beam;
scanning means coupled to a plurality of said plates to cause the ion beam to scan in a raster pattern across an area on a surface hit by said beam to form a first crater therein, said scanning means including a first sawtooth generator at one frequency and a second sawtooth generator at a second frequency;
a beam blanking circuit for selectively turning off said ion beam for forming a second crater within said first crater, said blanking circuit including a first compare and gate circuit responsive to said first sawtooth to produce a first blanking signal when said first sawtooth is below a selectable lower value or above a selectable upper value, said blanking circuit additionally including a second compare and gate circuit responsive to said second sawtooth to produce a second blanking signal when said second sawtooth is below said selectable lower value or above said selectable upper value, said blanking circuit being operative to turn off said ion beam whenever either said first blanking signal or said second blanking signal is being produced.

8. The primary ion gun of claim 7 additionally including means to selectably enable or disable said beam blanking circuit.

* * * * *